(12) United States Patent
Lambrache (10) Patent No.: US 7,460,411 B2
(45) Date of Patent: Dec. 2, 2008

(54) ARRAY SOURCE LINE (AVSS) CONTROLLED HIGH VOLTAGE REGULATION FOR PROGRAMMING FLASH OR EE ARRAY

(75) Inventor: Emil Lambrache, Campbell, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/971,597

(22) Filed: Jan. 9, 2008

(65) Prior Publication Data

US 2008/0106949 A1    May 8, 2008

Related U.S. Application Data

(62) Division of application No. 11/285,089, filed on Nov. 21, 2005, now Pat. No. 7,339,832.

(51) Int. Cl.
*G11C 11/34* (2006.01)
(52) U.S. Cl. .................... 365/185.29; 365/185.2
(58) Field of Classification Search ............ 365/185.29, 365/185.2, 185.18, 185.11
See application file for complete search history.

(56) References Cited

U.S. PATENT DOCUMENTS

| | | | | |
|---|---|---|---|---|
| 5,859,796 A | * | 1/1999 | Cleveland | 365/185.2 |
| 5,933,366 A | * | 8/1999 | Yoshikawa | 365/185.03 |
| 6,222,771 B1 | * | 4/2001 | Tang et al. | 365/185.22 |
| 7,110,298 B2 | * | 9/2006 | Moogat et al. | 365/185.18 |

* cited by examiner

*Primary Examiner*—Anh Phung
(74) *Attorney, Agent, or Firm*—Schwegman, Lundberg & Woessner, P.A.

(57) ABSTRACT

A method for programming a Flash memory array comprises coupling at least one of a current source and a potential source to at least one selected bitline of a Flash memory array, monitoring a potential $V_{AVSS}$ of an array VSS line by means of a comparator, allowing the array VSS line to electrically float until the potential $V_{AVSS}$ is approximately equal to a reference potential $V_{ref}$, and terminating the programming by de-coupling at least one of the current source and the potential source.

5 Claims, 4 Drawing Sheets

ARRAY SOURCE LINE (AVSS) CONTROLLED HIGH VOLTAGE REGULATION FOR PROGRAMMING FLASH OR EE ARRAY

CROSS-REFERENCE TO RELATED APPLICATION

This is a divisional of application Ser. No. 11/285,089, filed Nov. 21, 2005, now U.S. Pat. No. 7,339,832, issued on Mar. 4, 2008.

TECHNICAL FIELD

The present invention is related to integrated circuits. More specifically, the present invention provides an improved method and apparatus for controlling an electrical potential coupled to a floating gate of a floating gate transistor.

BACKGROUND ART

Non-volatile memories comprise an important component in numerous electronic devices in use today. An especially useful type of non-volatile memory is the EEPROM (electrically erasable programmable read-only memory). Flash memory (also referred to as Flash EEPROM memory) is a type of EEPROM memory; a distinctive feature of Flash EEPROMs is the possibility of erasing large groups of memory cells simultaneously). For example, the erase process may be applied to the array globally (full chip erase) or partially by a particular portion of the array (sector erase). The groups of memory cells which are simultaneously erased have their source electrodes connected to a common source line.

The cells of Flash memory typically incorporate a double gate MOSFET transistor. The double gate MOSFET transistor comprises an electrically isolated polysilicon gate (the floating gate) placed above a channel region with the interposition of a gate dielectric (typically an oxide of silicon, referred to as a tunnel oxide). A control gate, typically fabricated using a second polysilicon layer, is insulatively disposed over the floating gate. The double gate MOSFET may be programmed by Fowler-Nordheim tunneling or by channel hot electron injection at the drain region, and is erased by Fowler-Nordheim tunneling. The present invention relates to EEPROM memories where both programming and erase are accomplished by Fowler-Nordheim tunneling.

When the floating gate stores a negative charge, the double gate MOSFET has a relatively high threshold voltage and the associated Flash memory cell is said to be in an erased state. When a Flash memory cell is in an erased state, the negative charge stored on the floating gate prevents the double gate MOSFET from conducting at the voltages applied during a read operation.

When the floating gate stores a neutral or positive charge, the double gate MOSFET has a relatively low threshold voltage and the associated Flash memory cell is said to be in a programmed state. When a Flash cell is in a programmed state, the neutral or positive charge stored on the floating gate enables the double gate MOSFET to conduct at the voltages applied during a read operation.

Variations occur in the size and composition of double gate MOSFETs during their fabrication. As a result, some Flash cells can have slightly thicker or thinner tunnel oxide. The tunnel oxide thickness variation results in changes in the threshold voltage. In general, the threshold voltage of an erased cell is typically a positive value, $V_{te}$. The threshold voltage of a programmed cell is typically a negative value, $V_{tp}$. The difference between $V_{te}$ and $V_{tp}$ is referred to as the program margin, $V_{pm}$:

$$V_{pm} = V_{te} - V_{tp} \qquad (1)$$

A relatively large program margin $V_{pm}$ is desirable because a large program margin $V_{pm}$ makes it easier to distinguish a programmed cell from an erased cell. In other words, a large value for $V_{pm}$ makes it easy to read the cell content.

Due to wear-out mechanisms in Flash cells, the program margin $V_{pm}$ is not stable; rather, $V_{pm}$ decreases with each program/erase cycle. Over the course of many program/erase cycles, the margin is reduced to the point that the cell fails— the contents can no longer be read reliably. Over-programming and over-erasing a Flash cell causes the diminution of $V_{pm}$ to occur more rapidly. Thus, in order to maximize the Flash memory cell (and hence, the Flash memory array) operating lifetime, the program and erase operations must be well-controlled. In particular, the program operation must raise the floating gate potential sufficiently to achieve an adequate value for $V_{tp}$, but must at the same time provide for limiting the floating potential to avoid over-programming the cell.

In the prior art, methods for control of the cell programming operation have been directed to limiting the potential of the bitline, as in U.S. Pat. No. 6,865,110 to Jae-Kwan Park. U.S. Pat. No. 6,507,067 to Fratin et al. describes a Flash EEPROM comprising single-transistor Flash memory cells. The Flash EEPROM incorporates a current limiting resistor in association with a diode-based clamp to provide a voltage limitation on a common source line during an erase operation. The diode-based clamp lacks a capability for convenient adjustment of the source line potential, relying upon a diode turn-on characteristic to limit the source line potential. The configuration described in the '067 patent does not enable the source line potential to provide a direct measure of the floating gate potential during a programming operation, as described infra for the present invention. What is needed is a means for providing improved control of the potential coupled to the floating gate of a Flash memory device during programming. In particular, an approach that is appropriate to a two-transistor Flash cell configuration is desired, since the two-transistor configuration is commonly employed in a substantial number of Flash memory configurations.

SUMMARY OF THE INVENTION

These needs have been met in the present invention which presents a method and an apparatus for programming a Flash memory cell within a Flash memory array. The Flash memory cell includes a select transistor and a floating gate transistor. A voltage comparator coupled to an array VSS line common to all Flash memory cells in the Flash memory array provides a means of directly responding to the potential of a floating gate within the floating gate transistor. A change in the floating gate potential of the Flash memory cell undergoing an erase operation is regulated by means of a first capacitive coupling ratio. A change in the floating gate potential of the Flash memory cell undergoing a write (programming) operation is regulated by means of a second capacitive coupling ratio in conjunction with means for shutting off a voltage/current source coupled to the Flash memory cell by means of a bitline. Electrical stress impressed upon a Fowler-Nordheim diode within the Flash memory cell may be controlled by means of limiting the rise time of a select line potential during the erase operation and by limiting the rise time of a bitline potential during the write operation.

DETAILED DESCRIPTION OF THE INVENTION

In the discussions infra, it will be appreciated by those skilled in the art that mosfet transistors are typically configured as symmetrical devices, and consequently the interchange of the terminals named source and drain has no effect on the operation of the device. In conventional nomenclature, a conventional electrical current is presumed to flow into the source terminal of a PMOS transistor, and out from the source terminal of an NMOS transistor. However, certain applications render the terminology ambiguous. One example is a passgate which may experience control current flow in both directions through the devices comprising the passgate. For this reason, although the terms source and drain are applied infra, it is to be understood that they are not intended as limiting with respect to the direction of current through a device. Rather, the direction of current is to be understood on the basis of the bias potentials applied to the device terminals.

Figure 1A:
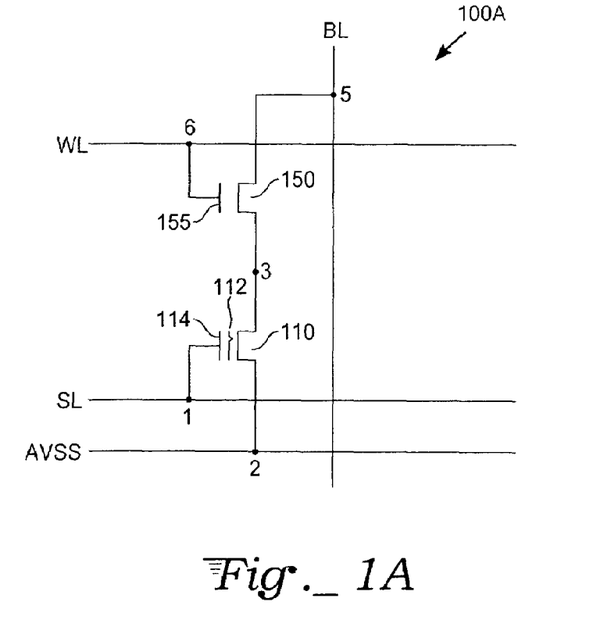
FIG. 1A is a circuit schematic of a Flash memory cell according to an exemplary embodiment of the present invention.

With reference to FIG. 1, a circuit schematic for a Flash memory cell 100A comprises a double gate NMOS transistor 110 and an NMOS select transistor 150. The double gate NMOS transistor 110 further comprises a floating gate 112 and a control gate 114. The NMOS select transistor 150 further comprises a polysilicon gate 155. In an exemplary embodiment of the present invention, the floating gate 112 may be fabricated from a first polysilicon layer applied during the manufacture of the Flash memory cell 100A. The control gate 114 and the polysilicon gate 155 are fabricated from a second polysilicon layer applied during the manufacture of the Flash memory cell 100A. Those skilled in the art will appreciate that the floating gate 112 may be separated from a conducting region of the double gate NMOS transistor 110 by an insulating layer of dielectric material, typically referred to as a tunnel oxide. Those skilled artisans will further recognize that a plurality of dielectric materials may comprise the tunnel oxide, for example, silicon dioxide, nitrided silicon dioxide, and high-K dielectric materials. The tunnel oxide is capable of conduction by a mechanism known as Fowler-Nordheim tunneling when subjected to a sufficiently high electric potential. In an exemplary embodiment of the present invention, the tunnel oxide substantially begins conducting when subjected to an electric potential of about seven volts. Conduction is possible in either direction, depending on the polarity of the applied potential.

The drain terminal of the NMOS select transistor 150 is coupled to a circuit node 5 and to a bitline BL. The bitline BL has an associated bitline potential $V_{BL}$. The gate terminal of the NMOS transistor is coupled to the polysilicon gate 155, to a circuit node 6, and to a word line WL. The word line WL has an associated word line potential $V_{WL}$. The source terminal of the NMOS select transistor 150 is coupled to a circuit node 3 and to the drain terminal of the double gate NMOS transistor 110. The control gate 114 of the double gate NMOS transistor 110 is coupled to the gate terminal of the double gate NMOS transistor 110, to a circuit node 1, and to a select line SL. The select line SL has an associated select line potential $V_{SL}$. The source terminal of the floating gate transistor 110 is coupled to a circuit node 2 and to an array VSS line AVSS. The array VSS line AVSS has an associated array VSS line potential $V_{AVSS}$.

Those skilled in the art will appreciate that in accordance with convention for the construction of circuit schematic diagrams, intersections of line elements in FIG. 1A, and in figures introduced infra, do not represent electrical connection, unless so indicated by the presence of a dot. Skilled artisans will further appreciate that the bulk terminal connections for the NMOS select transistor 150 and the double gate NMOS transistor 110 are not explicitly shown, but are understood to be connected to a circuit ground potential of approximately zero volts.

Although a single Flash memory cell 100A is depicted in FIG. 1A, a plurality of Flash memory cells 100A is coupled in a row and column configuration to comprise a Flash memory array. A plurality of word lines WL, select lines SL, and bitlines BL are interposed throughout the array such that a unique combination of a word line WL, select line SL, and bitline BL is coupled to a specific Flash memory cell 100A, in a configuration known to those skilled in the art. The array VSS line AVSS is common to all instantiations of Flash memory cell 100A in the Flash memory array. Additional details relevant to the present invention concerning the instantiation of a plurality of Flash memory cells 100A are explained infra.

Figure 1B:
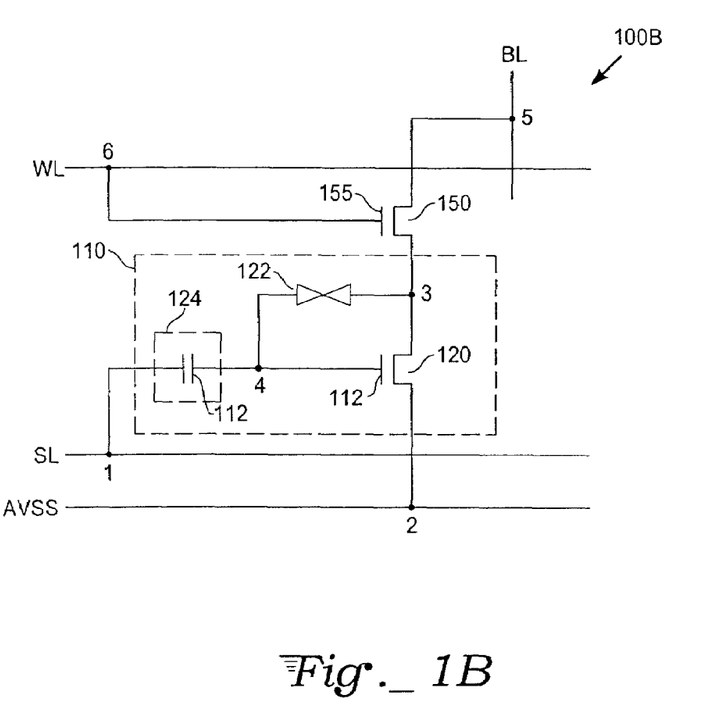
FIG. 1B is circuit schematic of a Flash memory cell in which a double gate NMOS transistor is represented by an equivalent circuit model.

With reference to FIG. 1B, an alternate circuit schematic 100B of the Flash memory cell 100A, the double gate NMOS transistor 110 is represented by an equivalent circuit model comprising a native NMOS transistor 120, a Fowler-Nordheim diode 122, and an oxide-nitride-oxide (ONO) capacitor 124. The drain terminal of the native NMOS transistor 120 is coupled to the circuit node 3 and to a first terminal of the Fowler-Nordheim diode 122. The source terminal of the native NMOS transistor 120 is coupled to the circuit node 2 and to the array VSS line AVSS. A second terminal of the Fowler-Nordheim diode is coupled to a circuit node 4, to the gate terminal of the native NMOS transistor 120, and to a first terminal of the oxide-nitride-oxide (ONO) capacitor 124. A second terminal of the oxide-nitride-oxide (ONO) capacitor 124 is coupled to the circuit node 1 and to the select line SL. The floating gate 112 is coupled to the circuit node 4 and comprises the gate of the native NMOS transistor 120. The floating gate 112 further comprises the first terminal of the oxide-nitride-oxide (ONO) capacitor 124.

Those skilled in the art will recognize that the potential present at the circuit node 4 corresponds to the potential of the floating gate 112, and that the potential present at node 4 determines the threshold voltage of the double gate NMOS transistor 110, and hence, the programming state of the double gate NMOS transistor 110. The oxide-nitride-oxide (ONO) capacitor 124 represents the capacitive coupling between the floating gate 112 and the control gate 114. In this exemplary embodiment of the present invention, the dielectric material separating the floating gate 112 and the control gate 114 may be a stack comprising silicon dioxide/silicon nitride/silicon dioxide.

In this exemplary embodiment the NMOS select transistor 150 may be fabricated to have a threshold voltage of approximately 0.7 volts, a value typical for an NMOS transistor operating in an enhancement mode. The native NMOS transistor 120 may be fabricated to have a threshold voltage of approximately zero volts. The native NMOS transistor 120 is therefore sensitive to the potential of the floating gate 112. (The floating gate potential is referred to hereafter as $V_{FG}$.) If the floating gate potential VFG is approximately positive three volts, the native NMOS transistor 120 is substantially conducting in the absence of any applied bias on the double gate NMOS transistor 110 control gate terminal 114. If the floating gate potential $V_{FG}$ is approximately negative three volts, the native NMOS transistor 120 is substantially non-conducting in the absence of any applied bias on the double gate NMOS transistor 110 control gate terminal 114. The techniques employed to fabricate the NMOS select transistor 150 and the native NMOS transistor 120 are well known in the relevant art.

The relationship between the voltages present at the circuit nodes 1-4 is relevant to proper operation of the FLASH memory cell 100A (FIG. 1A). The relationship may be better understood with reference to FIG. 2, a voltage coupling model 200 for capacitive voltage coupling within a portion of the Flash memory cell 100A. The voltage coupling model 200 is first discussed in terms of its configuration as illustrated. The correspondence between the elements of the voltage coupling model 200 and the elements of the FLASH memory cell 100A is then introduced. The circuit nodes 1-4 in FIG. 2 correspond to the circuit nodes 1-4 presented in FIGS. 1A and 1B.

Figure 2:
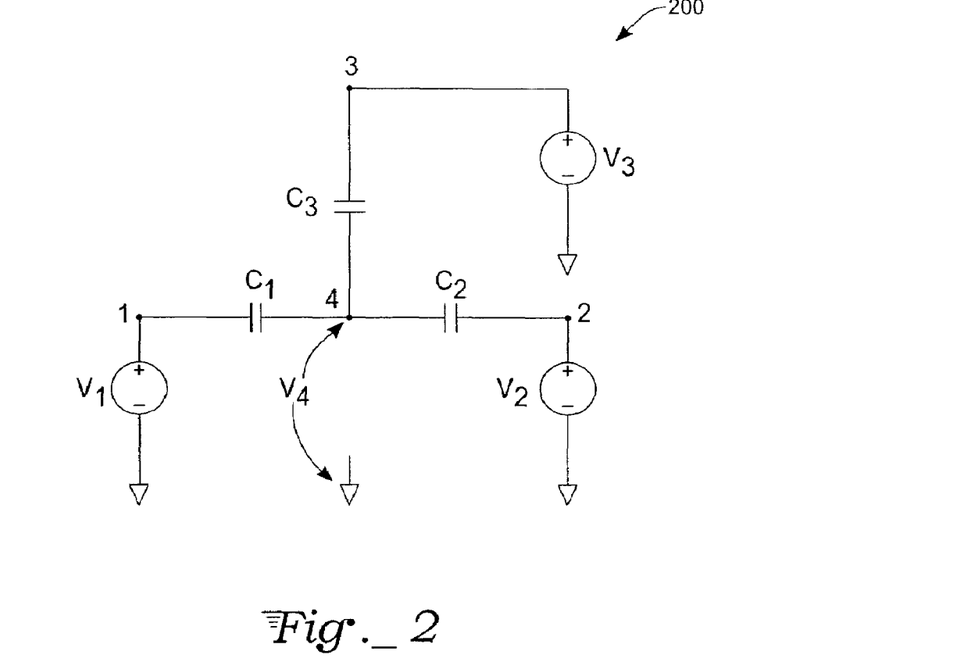
FIG. 2 is model for capacitive voltage coupling within a portion of a Flash memory cell.

The voltage coupling model comprises a first voltage generator having a potential $V_1$, a positive terminal coupled to the circuit node 1, and a negative terminal coupled to a ground potential. A capacitor $C_1$ has a first terminal coupled to the circuit node 1 and a second terminal coupled to the circuit node 4. A second voltage generator has a potential $V_2$, a positive terminal coupled to the circuit node 2, and a negative terminal coupled to the ground potential. A capacitor $C_2$ has a first terminal coupled to the circuit node 2 and a second terminal coupled to the circuit node 4. A third voltage generator has a potential $V_3$, has a positive terminal coupled to the circuit node 3 and a negative terminal coupled to the ground potential. A capacitor $C_3$ has a first terminal coupled to the circuit node 3 and a second terminal coupled to the circuit node 4.

Skilled artisans will recognize that in the absence of any changes occurring in the voltage potentials $V_1$-$V_3$, the voltage potential $V_4$ can assume a variety of values (depending on the charge stored on node 4) and remain in a stable configuration. However, irrespective of the charge stored on node 4, a change in the voltage potential $V_4$ results whenever any of the voltage potentials $V_1$-$V_3$ undergoes a change. The change in the voltage potential $V_4$ is given by a well-known formula:

$$\Delta V_4 = \frac{C_1 \Delta V_1 + C_2 \Delta V_2 + C_3 \Delta V_3}{C_1 + C_2 + C_3} \quad (1)$$

Thus, if the values of the capacitors $C_1$-$C_3$ are known, the effect of a change in any of the voltage potentials $V_1$-$V_3$ upon the voltage potential V4 can be determined.

The capacitor $C_1$ in FIG. 2 corresponds to the oxide-nitride-oxide (ONO) capacitor 124 of FIG. 1B. The capacitor $C_2$ in FIG. 2 corresponds to capacitance between the gate terminal and the source terminal of the native NMOS transistor 120, when the native NMOS transistor 120 is biased into conduction. When the native NMOS transistor 120 is biased off, the capacitor $C_2$ in FIG. 2 corresponds to the capacitance of between the gate terminal and the bulk terminal (also known as a substrate connection) of the native NMOS transistor 120. The capacitance $C_2$ is also referred to as $C_g$ infra.

The capacitor $C_3$ in FIG. 2 corresponds to the capacitance introduced by the Fowler-Nordheim diode 122 between the circuit nodes 3 and 4. The capacitance $C_2$ is also referred to as $C_{FN}$ infra. In light of this exemplary embodiment of the present invention, $C_2$ is negligibly small in comparison to the capacitances of $C_1$ and $C_3$, and may be ignored in subsequent analyses.

The voltage potential $V_1$ in FIG. 2 corresponds to the select line potential $V_{SL}$. The voltage potential $V_2$ in FIG. 2 corresponds to the array VSS line potential $V_{AVSS}$. When the NMOS select transistor 150 is biased into conduction the voltage potential $V_3$ in FIG. 2 corresponds to the bitline potential $V_{BL}$.

Based upon the discussion supra, the following table summarizes the capacitance/voltage correspondences between FIGS. 1A, 1B, and 2:

| FIGS. 1A, 1B | FIG. 2 Model |
|---|---|
| $C_{ONO}$ | $C_1$ |
| $C_G$ | $C_2$ |
| $C_{FN}$ | $C_3$ |
| $V_{SL}$ | $V_1$ |
| $V_{BL}$ | $V_3$ |
| $V_{AVSS}$ | $V_2$ |
| $V_{FG}$ | $V_4$ |

With reference to the table supra, formula (1) can be re-written as:

$$\Delta V_{FG} = \frac{C_{ONO}\Delta V_{SL} + C_{FN}\Delta V_{BL} + C_G \Delta V_{AVSS}}{C_{ONO} + C_{FN} + C_G} \quad (2)$$

Two applications of formula (2) are of particular interest; specifically, erasing of the Flash memory cell and programming of the Flash memory cell.

Three operations are typically performed upon Flash memory cells and Flash memory arrays: erase, write, and read. Each of these operations is detailed according to this exemplary embodiment.

Erase

The erase operation may be performed upon all cells of the Flash memory array simultaneously, with each Flash memory cell 100A (FIG. 1A) in the Flash memory array subjected to similar biasing conditions, as follows: The bitline BL is coupled to a potential of approximately zero volts. The word line WL is coupled to a potential of approximately 13 to 14 volts, biasing the NMOS select transistor 150 into conduction, thereby coupling a potential of zero volts to the circuit node 3. In this exemplary, the erase operation follows the read operation; the read operation couples the array VSS line AVSS and the select line SL to a potential of zero volts. During erase, the array VSS line AVSS (and therefore the circuit node 2) remains coupled to the potential of zero volts.

Figure 3:
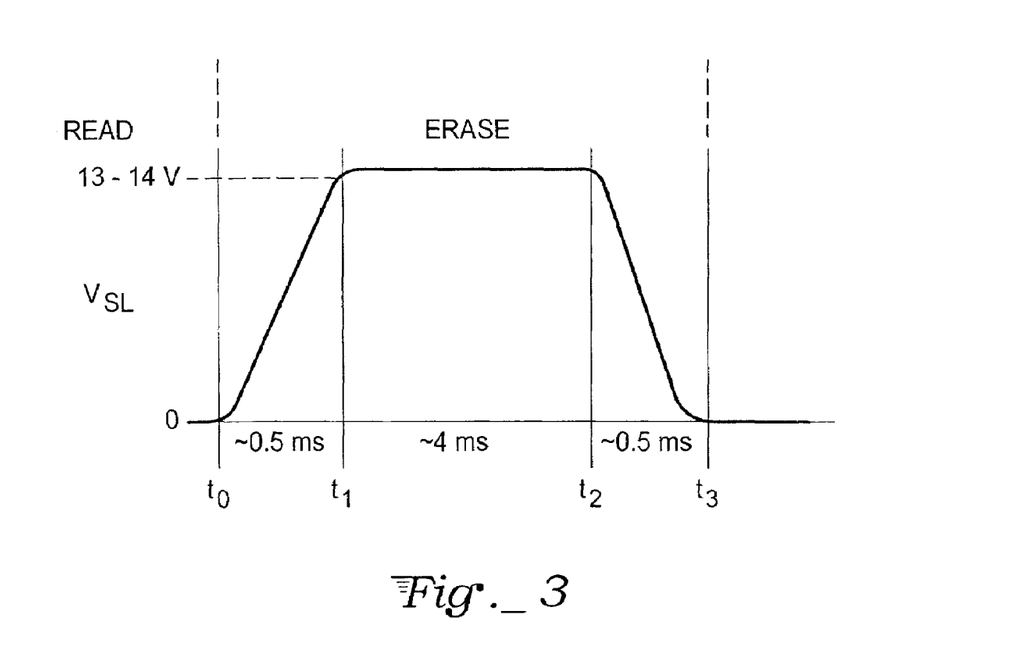
FIG. 3 is a timing diagram for a Flash memory array erase operation.

The erase process is initiated by raising the select line potential $V_{SL}$ from zero volts to approximately 13-14 volts. With reference to FIG. 3, a timing diagram for a Flash memory erase operation according to this exemplary embodiment, the select line potential $V_{SL}$ transitions from approximately zero volts to 13-14 volts in about 0.5 milliseconds (that is, about five ten-thousandths of a second) during the interval spanning $t_0$ to $t_1$. The select line potential $V_{SL}$ remains at 13-14 volts for approximately 4 milliseconds during the interval from $t_1$ to $t_2$, during which the Flash memory cell 100A potentials equilibrate. The select line potential $V_{SL}$ then returns to approximately zero volts in about 0.5 milliseconds during the interval from $t_2$ to $t_3$.

The events which occur within the Flash memory cell 100 during the erase operation depend upon the initial condition of the cell.

Erase: Initially Programmed Cell

If the Flash memory cell 100A is initially programmed, the double gate NMOS transistor 110 (FIG. 1A) has a floating gate potential $V_{FG}$ of approximately positive three volts; that is: $V_4 = V_{FG} = +3v$. When the select line potential $V_{SL}$ transitions during the interval from $t_0$ to $t_1$, the change in the select line potential $V_{SL}$ is coupled to the floating gate potential $V_{FG}$ according to formula (2) as follows:

$$\Delta V_{FG} = \Delta V_{SL} \frac{C_{ONO}}{C_{ONO} + C_G + \cancel{C}_{FN}} \tag{3}$$

The slashed value $\cancel{C}_{FN}$ in formula (3) indicates that the capacitance of the Fowler-Nordheim diode may be ignored without appreciably affecting the result.

The term $$\frac{C_{ONO}}{C_{ONO} + C_G}$$

is referred to as a first coupling ratio. In this exemplary embodiment, the double gate NMOS transistor 110 is constructed so as to give a value for the first coupling ratio approximately equal to 0.7 to 0.75. Using the value 0.75, the change in the floating gate potential $V_{FG}$ can be computed as:

$$\Delta V_{FG} \big|_{t_0}^{t_1} = \Delta V_{SL} \big|_{t_0}^{t_1} (0.75) = (13.5 \text{ v})(0.75) \tag{4}$$
$$\approx 10 \text{ v}$$

In formula (4) supra, a potential of 13.5 volts may be employed as a representative quantity for the nominal range of values associated with $\Delta V_{SL}$.

Using the result from formula (4) and the knowledge that the floating gate potential $V_{FG}$ for the initially programmed Flash memory cell 100A is approximately positive three volts, the value of $V_{FG}$ can be computed at time $t_1$ by the relation:

$$\Delta V_{FG} \big|_{t_1} = V_{FG} \big|_{t_0} + \Delta V_{FG} \big|_{t_0}^{t_1} \tag{5}$$
$$\approx 3 \text{ v} + 10 \text{ v} = +13 \text{ v}$$

However, with reference to FIG. 1B, recall that the Fowler-Nordheim diode 122 substantially conducts whenever the potential across its terminals exceeds approximately seven volts. Thus, the maximum potential which the circuit node 4 (and hence the floating gate potential $V_{FG}$) can achieve is approximately seven volts, because the circuit node 3, is coupled to a potential of approximately zero volts. Therefore, because the Fowler-Nordheim diode 122 starts conducting, effectively bypassing the capacitor $C_G$, formula (5) does not apply and the floating gate potential $V_{FG}$ is instead:

$$V_{FG} \big|_{t_1} \approx +7 \text{v} \tag{6}$$

With reference to FIG. 3, the select line potential $V_{SL}$ remains approximately constant during the interval from $t_1$ to $t_2$, during this interval, the potentials within the Flash memory cell 100A equilibrate and remain approximately constant. Because the Fowler-Nordheim diode 122 is biased into conduction, the charge stored on node 4 is changed during the interval from t0 to t2, in accordance with a purpose of the erase operation.

When the select line potential $V_{SL}$ transitions during the interval from $t_2$ to $t_3$, the change in the select line potential $V_{SL}$ is again coupled to the floating gate potential according to formula (2). The coupling relationship now becomes:

$$\Delta V_{FG} \big|_{t_2}^{t_3} = \Delta V_{SL} \big|_{t_2}^{t_3} (0.75) = (-13.5 \text{ v})(0.75) \tag{7}$$
$$\approx -10 \text{ v}$$

Recalling that $V_{FG}$ is approximately seven volts from time $t_1$ to $t_2$, and using formula (7):

$$\Delta V_{FG} \big|_{t_3} = V_{FG} \big|_{t_2} + \Delta V_{FG} \big|_{t_2}^{t_3} \tag{8}$$
$$= 7 \text{ v} - 10 \text{ v} = -3 \text{ v}$$

At the time t3, the potential across the terminals of the Fowler-Nordheim diode 122 is less than approximately seven volts, and the diode is biased off. This causes the node 4 and the floating gate 112 to be electrically isolated.

Examination of formula (8) shows that the final value for the floating gate potential $V_{FG}$ at time $t_3$ corresponds to the target value for an erased Flash memory cell, i.e., negative three volts. Therefore, formula (6) demonstrates that the erase operation may be successfully completed by the procedure outlined supra.

Erase: Initially Erased Cell

If the Flash memory cell is initially erased, the floating gate transistor has a floating gate potential $V_{FG}$ of approximately negative three volts; that is: $V_4 = V_{FG} = -3v$. When the select line potential $V_{SL}$ transitions during the interval from $t_0$ to $t_1$, the change in the select line potential $V_{SL}$ is coupled to the floating gate potential according to formula (4) as described supra.

Using the knowledge that $V_{FG}$ is approximately negative three volts at time $t_0$, and using formula (4), the floating gate potential $V_{FG}$ is:

$$\Delta V_{FG} \big|_{t_1} = V_{FG} \big|_{t_0} + \Delta V_{FG} \big|_{t_0}^{t_1} \tag{9}$$
$$= -3 \text{ v} + 10 \text{ v} = +7 \text{ v}$$

Since the floating gate potential $V_{FG}$ at time $t_1$ does not produce a potential across the Fowler-Nordheim diode 122 exceeding approximately seven volts, the Fowler-Nordheim diode 122 does not conduct. Therefore, the result predicted by formula (9) is correct.

When the select line potential $V_{SL}$ transitions during the interval from $t_2$ to $t_3$, the change in the select line potential $V_{SL}$ is again coupled to the floating gate potential according to formula (2). The coupling relationship is now:

$$\Delta V_{FG}|_{t_2}^{t_3} = \Delta V_{SL}|_{t_2}^{t_3}(0.75) = (-13.5\text{ v})(0.75) \quad (10)$$
$$\approx -10\text{ v}$$

Recalling that $V_{FG}$ is approximately seven volts at time $t_2$, and using formula (7):

$$V_{FG}|_{t_3} = V_{FG}|_{t_2} + \Delta V_{FG}|_{t_2}^{t_3} \quad (11)$$
$$= 7\text{ v} - 10\text{ v} = -3\text{ v}$$

Examination of formula (11) shows that the final value for the floating gate potential $V_{FG}$ at time $t_3$ corresponds to the target value for an erased Flash memory cell, i.e., negative three volts. Therefore, formula (11) demonstrates that an initially erased Flash memory cell remains unchanged by the erase operation.

Write

The write operation selects a single word line at a time. In order to complete the programming of $2^n$ memory pages within the complete Flash memory array, the write operation may be performed $2^n$ times, thereby addressing the entire Flash memory array.

The write operation is a bit-wise operation; that is, the write operation may be specific to a single Flash memory cell 100A (FIG. 1A) within the Flash memory array. The write operation begins with selection of the specific Flash memory cell 100A to be programmed by means of an appropriate combination of bitline BL and word line WL settings: A grounded word line WL (i.e., the word line potential $V_{WL}$ is zero volts) is termed unselected. In this exemplary embodiment, selection of a word line WL comprises raising the word line potential $V_{WL}$ to approximately thirteen to fourteen volts, addressing a 256-byte word (also referred to as a page) of memory. Any instance of the Flash memory cell 100A coupled to an unselected word line WL is not programmed.

Individual bits within a selected memory page are selected for programming by selecting the bitline BL which intersects the specific Flash memory cell 100A instance to be programmed. Selection of the bitline BL comprises coupling the bitline BL to a current source capable of supplying a potential of approximately twelve volts, to be explained further infra. Bitlines which are grounded, floating, or have a bitline potential $V_{BL}$ tied to the array VSS line potential ($V_{AVSS}$) are unselected. Any instance of the Flash memory cell 100A coupled to an unselected bitline BL is not programmed.

Figure 4:
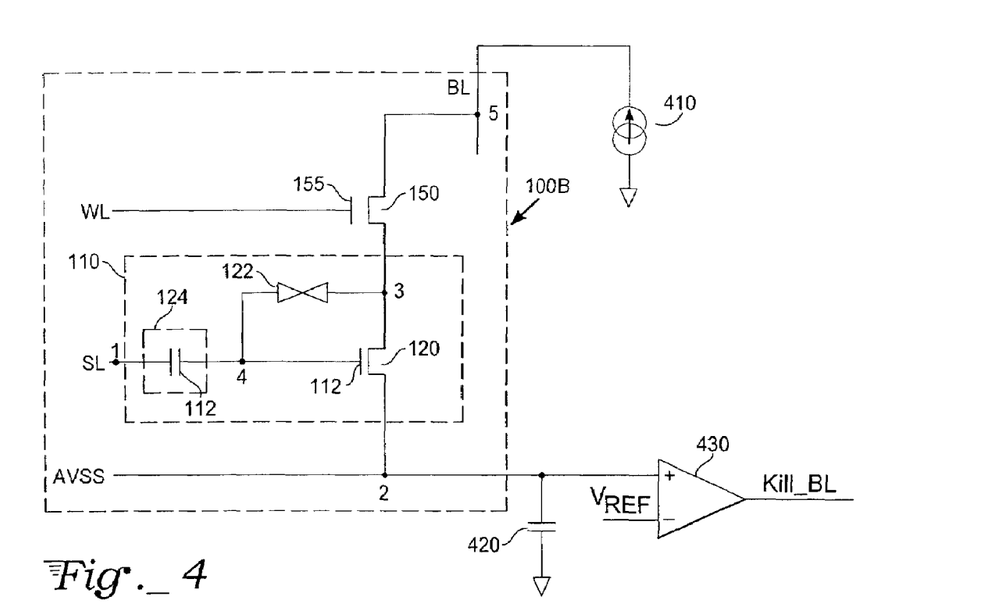
FIG. 4 is a circuit schematic of a Flash memory cell with control elements applicable to a programming operation according to an exemplary embodiment of the present invention.

With reference to FIG. 4, a Flash memory cell with control elements applicable to a programming operation according to this exemplary embodiment comprises the Flash memory cell 100B, a program current source 410, a parasitic capacitance 420, and a voltage comparator 430. During the write operation, the select line potential $V_{SL}$ is maintained at approximately zero volts for all instances of the select line SL comprising the Flash memory array. The word line WL coupled to the Flash memory cell to be programmed is selected; that is, the word line potential $V_{WL}$ is maintained at approximately thirteen to fourteen volts, biasing the NMOS select transistor 150 into conduction. The NMOS select transistor 150 couples the bitline BL and the bitline BL potential $V_{BL}$ to the circuit node 3.

Figure 5:
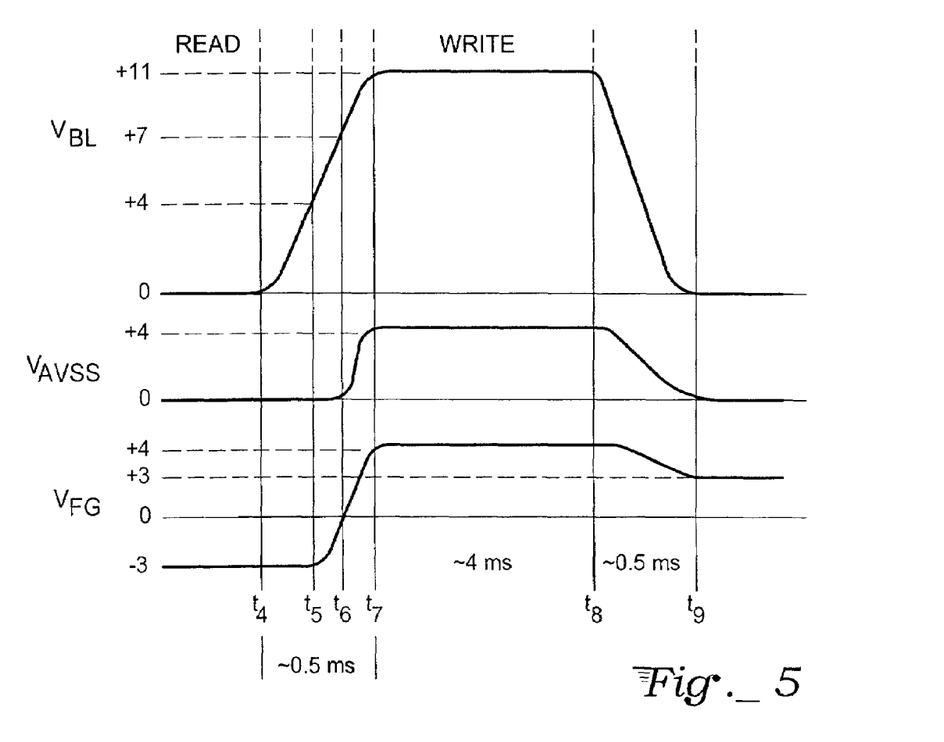
FIG. 5 is a timing diagram for a Flash memory cell programming operation.

The potential variations which occur on the bitline BL, the floating gate 112, and the array VSS line AVSS is now explained with reference to FIG. 5, a timing diagram for a Flash memory cell 100A write (programming) operation. The bitline potential $V_{BL}$ and the array VSS line potential $V_{AVSS}$ are initially at zero volts, as shown prior to time $t_4$. In this exemplary embodiment, the write operation may be preceded by the read operation. The read operation actively holds the array VSS line potential $V_{AVSS}$ low by means of a transistor coupling the array VSS line AVSS to the circuit ground. (Those skilled in the art will recognize that a variety of methods are available to maintain the array VSS line AVSS at ground potential.) Upon initiation of the write operation at time $t_4$, the array VSS line AVSS is allowed to electrically float. The program current source 410, coupled to the bitline BL, begins to increase the bitline potential $V_{BL}$, thereby selecting the bitline BL. The program current source 410 is capable of supplying approximately 40 micro-amperes of current at up to approximately twelve volts. The program current source 410 comprises an externally addressable shutdown capability which terminates the current in response to a bit line kill signal Kill_BL and isolates the program current source 410 electrically. Methods of constructing circuits such as the program current source 410 are well known to skilled artisans and are not included here to avoid obscuring the present invention.

The bitline potential $V_{BL}$ increases during the interval from $t_4$ to $t_5$. At time $t_5$, the bitline potential is approximately four volts. Since the circuit node 4 (and the floating gate potential $V_{FG}$) are at a potential of approximately negative three volts, the potential across the terminals of the Fowler-Nordheim diode 122 reaches approximately seven volts and the Fowler-Nordheim diode 122 begins to substantially conduct. The Fowler-Nordheim diode 122 couples the bitline potential $V_{BL}$ to the circuit node 4 and the floating gate potential $V_{FG}$ begins to track the bitline potential $V_{BL}$ such that $V_{FG} \approx V_{BL} - 7\text{v}$. At time $t_6$, the floating gate potential $V_{FG}$ reaches approximately zero volts, the threshold voltage of the native NMOS transistor 120. Thus, the native NMOS transistor 120 begins to conduct. The native NMOS transistor 120 is configured as a source repeater; in the source repeater configuration the conduction characteristic of the native NMOS transistor 120 approximately mirrors the potential on the floating gate 112 to the source terminal of the native NMOS transistor 120. Since the array VSS line AVSS is electrically floating, the action of the native NMOS transistor 120 is to match the array VSS line potential $V_{AVSS}$ to that of the floating gate potential $V_{FG}$.

The bitline potential $V_{BL}$, the floating gate potential $V_{FG}$, and the array VSS line potential $V_{AVSS}$ continue to increase in the interval from $t_6$ to $t_7$. The parasitic capacitance 420, which may be primarily comprised of capacitance arising from an n+ diffusion-to-substrate capacitance in the Flash memory cell 100A (FIG. 1A), is charged as the array VSS line potential $V_{AVSS}$ increases. At time $t_7$, the array VSS line potential $V_{AVSS}$ reaches four volts. The voltage comparator 430 compares the array VSS line potential $V_{AVSS}$ with a reference potential $V_{REF}$. The reference potential $V_{REF}$ is approximately four volts. At time $t_7$, the voltage comparator 430 senses that the array VSS line potential $V_{AVSS}$ matches the reference potential $V_{REF}$. The voltage comparator 430 sets the bit line kill signal Kill_BL so as to cause the program current source 410 to shut down.

In this exemplary embodiment, the time duration from $t_4$ to $t_7$ is approximately 0.5 milliseconds. This time interval represents a useful feature of the invention. By limiting the rate at which the bitline potential $V_{BL}$ is increased (i.e., by limiting the rise time of $V_{BL}$), the rate of potential increase across the Fowler-Nordheim diode 122 is also limited. Rapid voltage changes across the Fowler-Nordheim diode 122 can induce electrical breakdown and damage the diode, thereby shortening the useful lifetime of the Flash memory cell 100A. (Methods of controlling the rise time of a potential are known to skilled artisans. These methods can include incorporation of resistive/capacitive components, limiting the strength of a current source by size control of drive transistors, controlled biasing of drive transistors, and other means.)

The interval from $t_7$ to $t_8$ is approximately 4 milliseconds in length and allows potentials within the Flash memory cell 100A to stabilize. The potentials are relatively constant due to the charge storage provided by the various capacitances comprising and coupled to the cell as described supra. Furthermore, the bitline BL and the array VSS line AVSS are electrically floating during this time interval, preventing leakage paths from altering the potentials within the Flash memory cell 100A.

At time $t_8$, the bitline BL and the array VSS line are coupled to a potential of zero volts (through a discharge device which is not shown to avoid obscuring the present invention), and the bitline potential $V_{BL}$ and the array VSS line potential $V_{AVSS}$ begin to decrease. The Fowler-Nordheim diode 122 is not conducting; when the array VSS line potential $V_{AVSS}$ transitions during the interval from $t_8$ to $t_9$, the change in the select line potential $V_{SL}$ is coupled to the floating gate potential according to formula (2) as follows:

$$\Delta V_{FG} = \Delta V_{AVSS} \frac{C_G}{C_{ONO} + C_G + \cancel{C_{FN}}} \quad (12)$$

The slashed value $\cancel{C_{FN}}$ in formula (12) indicates that the capacitance of the Fowler-Nordheim diode may be ignored without appreciably affecting the result.

The term $$\frac{C_G}{C_{ONO} + C_G}$$

is referred to as a second coupling ratio. The double gate NMOS transistor 110 is constructed so as to give a value for the second coupling ratio approximately equal to 0.25. Using this value, the change in the floating gate potential $V_{FG}$ is given by:

$$\Delta V_{FG} |_{t_8}^{t_9} = \Delta V_{AVSS} |_{t_8}^{t_9} (0.25) = (-4 \text{ v})(0.25) \approx -1 \text{ v} \quad (13)$$

Using the result from formula (13) and the knowledge that the floating gate potential $V_{FG}$ for the Flash memory cell 100A at time $t_8$ is approximately positive four volts, the value of $V_{FG}$ is computed at time $t_9$ by the relation:

$$V_{FG} |_{t_9} = V_{FG} |_{t_8} + \Delta V_{FG} |_{t_8}^{t_9} \quad (14)$$
$$= 4 \text{ v} - 1 \text{ v} = +3 \text{ v}$$

Formula (14) shows that the desired floating gate potential $V_{FG}$ may be achieved at the conclusion of the write operation.

Several useful features of the present invention are now highlighted: The configuration of the native NMOS transistor 120 and the voltage comparator 430 provides a method for directly measuring the floating gate potential $V_{FG}$ during programming. It is to be appreciated that the final value for the floating gate potential $V_{FG}$ depends primarily upon the value of the second coupling ratio and the value of the reference potential $V_{REF}$. Skilled artisans will appreciate that the first and second coupling ratios are determined by the physical dimensions and other design attributes of the double gate NMOS transistor 110, and furthermore, that the present art enables a high degree of predictability and consistency in these attributes. Additionally, the present art enables the construction of voltage reference sources and voltage comparators with a high degree of control and precision. As a result, the methods of the present invention detailed supra facilitate control of the Flash memory cell 100A erase and write operations and result in a consistent value for the floating gate potential $V_{FG}$ at the conclusion of the write operation. In contrast, the prior art generally attempts to regulate the floating gate potential by regulation of the bitline potential in conjunction with control of the potential drop across the Fowler-Nordheim diode. The approach of the prior art may be compromised by significant variations the Fowler-Nordheim diode current-voltage characteristics. The present invention eliminates the need to precisely measure and control the Fowler-Nordheim diode current-voltage characteristics to achieve controlled programming.

Read

Figure 6:
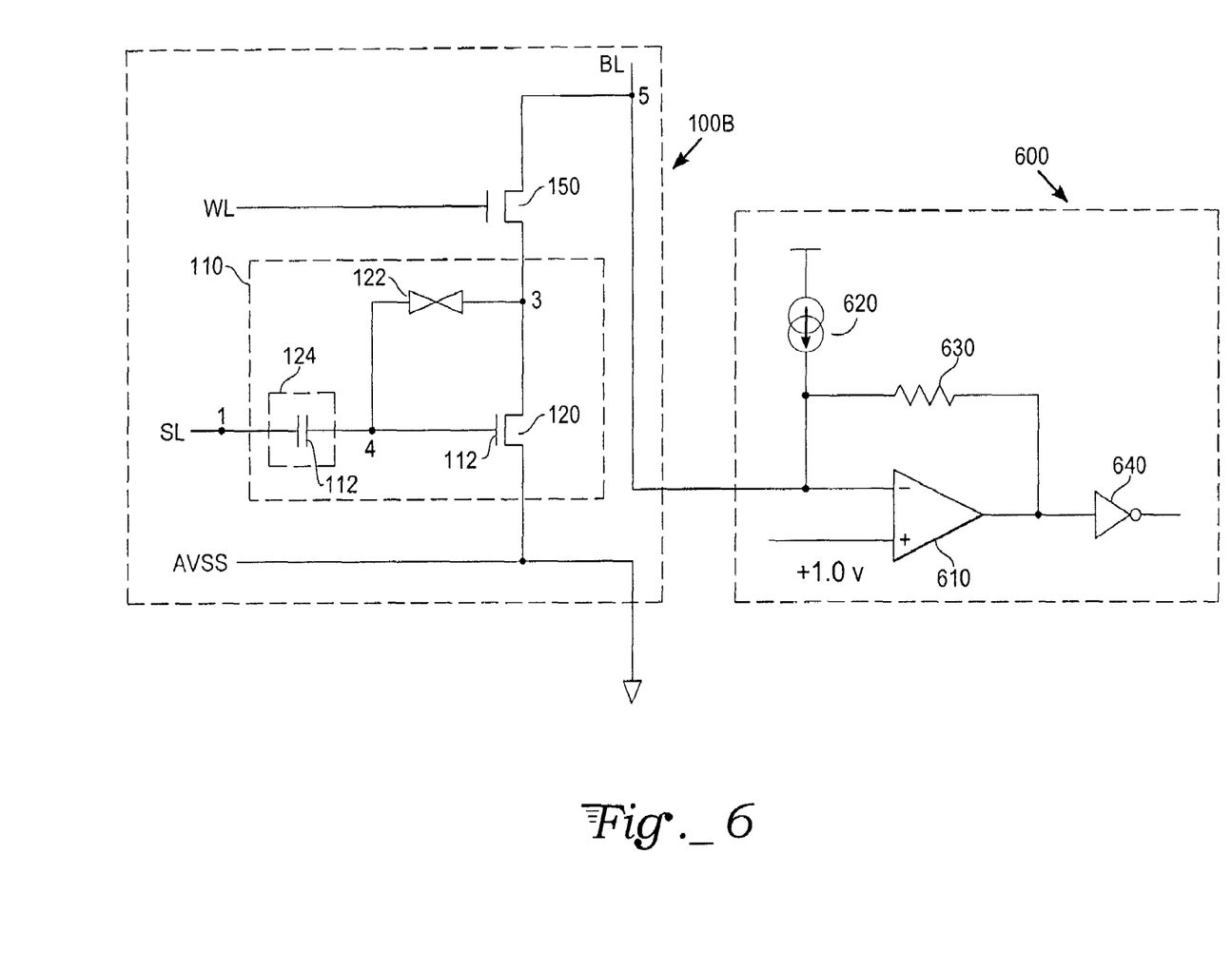
FIG. 6 is a circuit schematic of a Flash memory cell with elements applicable to a read operation.

The Flash memory cell 100A which has been erased and programmed by the methods presented supra is capable of being read by methods known to those skilled in the art. With reference to FIG. 6, a circuit schematic of a Flash memory cell 100B is coupled to elements applicable to a read operation comprising a sense amplifier circuit 600, the sense amplifier circuit 600 including an operational amplifier 610, a read reference current source 620, a feedback resistor 630, and an inverter 640.

The read operation is a bitwise operation, that is, the read operation may be specific to a single Flash memory cell 100B within a Flash memory array. During the read operation, the array VSS line potential $V_{AVSS}$ is held at approximately zero volts. That is, the array VSS line is grounded. The read operation begins with selection of the specific Flash memory cell 100B to be read by means of an appropriate combination of bitline BL and word line WL settings: A grounded word line WL (i.e., the word line potential $V_{WL}$ is zero volts) is termed unselected. In this exemplary embodiment, selection of a word line WL comprises raising the word line potential to a potential approximately equal to a VCC (general power supply) voltage within the circuit, where the VCC potential may be approximately three volts.

The word line WL coupled to the Flash memory cell to be read is selected; that is, the word line potential $V_{WL}$ is approximately three volts; this biases the NMOS select transistor 150 into conduction. The bitline BL coupled to the Flash memory cell 100B to be read is coupled to an inverting (−) terminal of the operational amplifier 610. Skilled artisans will recognize that this coupling may be usually accomplished by means of a decoder circuit (not shown to avoid obscuring the present invention), which allows a single sense amplifier circuit 600 to be employed for reading a plurality of bit lines BL.

In this exemplary embodiment, the read reference current source 620 is capable of sourcing approximately five microamperes of current at approximately one volt potential. The read reference current source 620 is coupled to the inverting (−) input of the operational amplifier, to a circuit node 7, and to a first terminal of the feedback resistor 630. An output of the operational amplifier 610 is coupled to a second terminal of the feedback resistor 630 and to an input terminal of the inverter 640. A potential of approximately positive one volt is applied to a non-inverting (+) terminal of the operational amplifier.

The inverter 640 produces a logic "high" or a logic "low" depending on the program state of the floating gate transistor 110:

Floating Gate Transistor 110 Erased

Assume first that the floating gate transistor 110 is in the erased condition. In the erased condition, the floating gate potential $V_{FG}$ has been shown supra to be approximately negative three volts. As a result, the double gate NMOS transistor 110 is biased off and no current passes through it. This means that no path exists for current originating within the read reference current source 620 through the Flash memory cell 100A. However, the configuration of the operational amplifier 610 is such that the operational amplifier 610 attempts to maintain both the inverting (−) terminal and the non-inverting (+) terminal at the same potential. That is, the operational amplifier 610 attempts to equalize the potentials at the inverting (−) and non-inverting (+) terminals. Furthermore, the construction of the operational amplifier 610 is such that virtually no current may enter the operational amplifier 610 by either of the inverting (−) terminal or the non-inverting (+) terminal.

In order maintain the circuit node 7 at approximately one volt [matching the non-inverting (+) terminal potential], the operational amplifier 610 deceases the potential of its output terminal below one volt (to approximately zero volts), enabling the read reference current source 620 current (approximately 5 microamperes) to flow through the feedback resistor 630. By diverting the read reference current through the feedback resistor 630, the operational amplifier 610 preserves the requirement that no current enters the through the inverting (−) terminal.

Because the potential at the output terminal of the operational amplifier 610 is approximately zero volts, the input to the inverter 640 is driven to a logic "low" and the output of the inverter 640 is logic "high." Therefore, the erased Flash memory cell 100A results in a logic "high" at the output of the inverter 640 during the read operation.

Floating Gate Transistor 110 Programmed

Next assume that the floating gate transistor 110 is in the programmed condition as a result of a write operation. In the programmed condition, the floating gate potential $V_{FG}$ has been shown supra to be approximately positive three volts. As a result, the double gate NMOS transistor 110 is biased into conduction. Consequently, a current path exists from the bitline BL through the NMOS select transistor 150 and the floating gate transistor 110 to the array VSS line AVSS, which is held at approximately zero volts.

Because a path exists for current originating within the read reference current source 620 through the Flash memory cell 100B, the current originating in the read reference current source 620 may be diverted through the Flash memory cell 100B. Furthermore, the read reference current source 620, being limited to a current of approximately five microamperes, cannot by itself maintain the potential of the circuit node 7 at one volt while being shunted to ground by the selected Flash memory cell 100B.

In order maintain the circuit node 7 at approximately one volt [matching the non-inverting (+) terminal potential], the operational amplifier 610 increases the potential of its output terminal, supplying additional current to the circuit node 7. In this exemplary embodiment, the total current through the programmed Flash memory cell 100A during the read operation is approximately 30 microamperes; thus, the operational amplifier 610 supplies approximately 25 microamperes via its output terminal.

Because the potential at the output terminal of the operational amplifier 610 increases to force a current of approximately 25 microamperes through the feedback resistor 630, the input to the inverter 640 is driven to a logic "high" and the output of the inverter 640 is logic "low." Therefore, the programmed (written) Flash memory cell results in a logic "low" at the output of the inverter 640 during the read operation.

The following table summarizes the approximate bias conditions detailed supra for the Flash memory cell 100A during the erase, write, and read operations:

|  | ERASE | READ | WRITE |
|---|---|---|---|
| $V_{BL}$ | 0 V | 0 V (unselected)<br>~1 V (selected) | 0 V (unselected)<br>11 V-12 V (selected) |
| $V_{SL}$ | 13 V-14 V | 0 V | 0 V. |
| $V_{WL}$ | 13 V-14 V | 0 V (unselected)<br>VCC ≈ 3 V (selected) | 0 V (unselected)<br>13 V-14 V (selected) |
| $V_{AVSS}$ | 0 V | 0 V | 0 V → 4 V → 0 V |

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, skilled artisans will appreciate that as device/process technology evolves, the operating voltages and times specified may be varied to accommodate changing performance attributes such as lower voltage transistor operation or different programming times. Additionally, the methods described in the specification supra may further be applied in the context of a specific Flash memory cell or Flash memory array, or alternately may be included as a portion of a more generalized microprocessor, microcontroller, or system on a chip which incorporates non-volatile memory. Finally, skilled artisans will appreciate that the methods described need not be limited to a specific ordering of read, write, and erase operations, provided that the potential changes necessary to a specific operation are preserved. The specification and drawings are, accordingly, to be regarded in an illustrative rather than a restrictive sense.

What is claimed is:

1. A method for erasing a Flash memory array, the method comprising:
    in a Flash memory cell comprising a select transistor and a double gate transistor, the select transistor including a drain terminal coupled to a bitline, a gate terminal coupled to a word line, and a source terminal coupled to a drain terminal of the double gate transistor, the double gate transistor further including a control gate terminal coupled to a select line and a source terminal coupled to an array VSS line, the array VSS line being configured to electrically float during a portion of a programming operation until a potential $V_{AVSS}$ of the array VSS line approximately matches a reference voltage $V_{ref}$, applying a potential of approximately zero volts to the select line;

applying a word line potential $V_{WL}$ to the word line in order to bias the select transistor into conduction;

applying a bitline potential $V_{BL}$ of approximately zero volts to the bitline;

fixing the array VSS potential $V_{AVSS}$ at approximately zero volts;

increasing a select line potential $V_{SL}$ applied to the select line from approximately zero volts to an erasing potential in a controlled time interval;

maintaining the select line potential $V_{SL}$ at the erasing potential for an erase time interval; and returning the select line potential $V_{SL}$ to approximately zero volts in a controlled time interval.

2. The method of claim 1, where the erase time interval is approximately 4 milliseconds and the controlled time interval is approximately 0.5 milliseconds.

3. The method of claim 1 where the erasing potential is approximately thirteen to fourteen volts and the reference voltage $V_{ref}$ is approximately four volts.

4. A method for erasing a flash memory array, the method comprising:

in a flash memory array having an array VSS line coupled to a comparator, the comparator monitoring a potential $V_{AVSS}$ of the array during a programming operation, coupling a potential of approximately zero volts to a source terminal and a drain terminal of a double gate transistor, the double gate transistor further including a control gate and a floating gate;

coupling a potential $V_{SL}$ to the control gate of the double gate transistor;

varying the potential $V_{SL}$ from an initial value of approximately zero volts to an elevated potential, the elevated potential chosen in conjunction with a first coupling ratio and a second coupling ratio of the double gate transistor such that a potential $V_{FG}$ of the floating gate reaches an approximately constant value independent of an initial state of the floating gate; and returning the potential $V_{SL}$ to approximately zero volts to produce an erased value for the potential $V_{FG}$.

5. The method of claim 4, wherein:

the elevated potential is approximately thirteen to fourteen volts;

the first coupling ratio has a value of approximately 0.7 to 0.75;

the second coupling ratio has a value of approximately 0.25;

the approximately constant value is about seven volts; and the erased value is about negative three volts.

* * * * *

UNITED STATES PATENT AND TRADEMARK OFFICE
CERTIFICATE OF CORRECTION

| | | |
|---|---|---|
| PATENT NO. | : 7,460,411 B2 | Page 1 of 1 |
| APPLICATION NO. | : 11/971597 | |
| DATED | : December 2, 2008 | |
| INVENTOR(S) | : Lambrache | |

It is certified that error appears in the above-identified patent and that said Letters Patent is hereby corrected as shown below:

In column 1, line 28, delete "simultaneously)." and insert -- simultaneously. --, therefor.

In column 3, line 25, delete "mosfet" and insert -- MOSFET --, therefor.

In column 6, line 10, delete "$C_g$" and insert -- $C_G$ --, therefor.

In column 7, line 63, delete "$\Delta V_{FG} | t_1$" and insert -- $V_{FG} | t_1$ --, therefor.

In column 7, line 65, delete "≈" and insert -- = --, therefor.

In column 8, line 12, delete " ≅7v " and insert -- ≈+7 v --, therefor.

In column 8, line 19, delete "t0" and insert -- $t_0$ --, therefor.

In column 8, line 19, delete "t2," and insert -- $t_2$, --, therefor.

In column 8, line 35, delete "$\Delta V_{FG} | t_3$" and insert -- $V_{FG} | t_3$ --, therefor.

In column 8, line 40, delete "t3," and insert -- $t_3$, --, therefor.

In column 8, line 64, delete "$\Delta V_{FG} | t_1$" and insert -- $V_{FG} | t_1$ --, therefor.

Signed and Sealed this

Twenty-third Day of February, 2010

David J. Kappos
*Director of the United States Patent and Trademark Office*